(12) United States Patent
Taniguchi

(10) Patent No.: US 10,217,879 B2
(45) Date of Patent: Feb. 26, 2019

(54) OPTICAL SEMICONDUCTOR DEVICE AND MANUFACTURING METHOD THEREOF

(71) Applicant: Renesas Electronics Corporation, Koutou-ku, Tokyo (JP)

(72) Inventor: Yoshito Taniguchi, Ibaraki (JP)

(73) Assignee: Renesas Electronics Corporation, Tokyo (JP)

(*) Notice: Subject to any disclaimer, the term of this patent is extended or adjusted under 35 U.S.C. 154(b) by 16 days.

(21) Appl. No.: 15/379,229

(22) Filed: Dec. 14, 2016

(65) Prior Publication Data

US 2017/0250293 A1    Aug. 31, 2017

(30) Foreign Application Priority Data

Feb. 29, 2016 (JP) ................................. 2016-037095

(51) Int. Cl.

| | |
|---|---|
| *H01L 31/0232* | (2014.01) |
| *H01L 31/0236* | (2006.01) |
| *G02B 6/32* | (2006.01) |
| *H01L 31/0224* | (2006.01) |
| *G02B 6/42* | (2006.01) |

(Continued)

(52) U.S. Cl.
CPC .......... *H01L 31/02327* (2013.01); *G02B 6/32* (2013.01); *G02B 6/4206* (2013.01); *G02B 6/4295* (2013.01); *H01L 31/02161* (2013.01); *H01L 31/02366* (2013.01); *H01L 31/022408* (2013.01); *H01L 31/101* (2013.01); *H01L 33/0095* (2013.01); *H01L 33/20* (2013.01); *H01L 31/03046* (2013.01); *H01L 31/10* (2013.01)

(58) Field of Classification Search
CPC ....... H01L 2924/00; H01L 2924/12041; H01L 31/00–31/208; H01L 31/0232–31/02327; H01L 31/054–31/056; H01L 2924/12031; H01L 29/868; H02S 50/00–50/15; H02S 40/20–40/22

USPC .............. 257/432, E31.038; 438/27, 127, 22
See application file for complete search history.

(56) References Cited

U.S. PATENT DOCUMENTS

| | | | | |
|---|---|---|---|---|
| 2011/0089515 | A1* | 4/2011 | Koyama | ........... H01L 31/02240 257/433 |
| 2013/0187181 | A1* | 7/2013 | Koyama | ........... H01L 31/02327 257/98 |
| 2015/0349206 | A1* | 12/2015 | Lowenthal | .............. H01L 33/38 257/40 |

FOREIGN PATENT DOCUMENTS

| | | |
|---|---|---|
| JP | H4-199525 A | 7/1992 |
| JP | 2004-200202 A | 7/2004 |

* cited by examiner

*Primary Examiner* — Jonathan Han
(74) *Attorney, Agent, or Firm* — Shapiro, Gabor and Rosenberger, PLLC

(57) ABSTRACT

The present invention provides an optical semiconductor device in which damage of a lens when being mounted and mounting displacement due to suction failures of a chip can be suppressed.
An optical semiconductor device according to an embodiment includes: a semiconductor substrate having a first surface and a second surface facing the first surface; an electrode formed over the first surface of the semiconductor substrate; an optical element that is electrically coupled to the electrode and is formed in the semiconductor substrate; and a lens arranged on the second surface side of the optical element. A concave part is formed in the second surface of the semiconductor substrate, and the lens is arranged at the bottom of the concave part. A top part on the second surface side of the lens is located on the first surface side relative to the second surface located around the concave part.

3 Claims, 10 Drawing Sheets

(51) Int. Cl.
*H01L 31/0216* (2014.01)
*H01L 31/101* (2006.01)
*H01L 33/00* (2010.01)
*H01L 33/20* (2010.01)
*H01L 31/0304* (2006.01)
*H01L 31/10* (2006.01)

OPTICAL SEMICONDUCTOR DEVICE AND MANUFACTURING METHOD THEREOF

CROSS-REFERENCE TO RELATED APPLICATIONS

The disclosure of Japanese Patent Application No. 2016-037095 filed on Feb. 29, 2016 including the specification, drawings and abstract is incorporated herein by reference in its entirety.

BACKGROUND

The present invention relates to an optical semiconductor device and a manufacturing method thereof, and particularly relates to an optical semiconductor device having a lens and a manufacturing method thereof.

As a light receiving device for optical communications, for example, an optical semiconductor device has been used from the past. As the optical semiconductor device, an optical semiconductor device having a back surface lens has been known. The optical semiconductor device according to the related art has a semiconductor substrate. The semiconductor substrate has a main surface and a back surface. An electrode is formed on the main surface side of the semiconductor substrate. A lens is formed on the back surface side of the semiconductor substrate (for example, Japanese Unexamined Patent Application Publication No. 2004-200202).

As a method of mounting the optical semiconductor device as described above, flip-chip mounting described in Japanese Unexamined Patent Application Publication No. Hei 4 (1992)-199525 has been proposed. In the flip-chip mounting described in Japanese Unexamined Patent Application Publication No. Hei 4 (1992)-199525, a suction collet and the like suck around a lens on the back surface side of a substrate of the optical semiconductor device.

SUMMARY

In the optical semiconductor device described in Japanese Unexamined Patent Application Publication No. 2004-200202, when the suction collet sucks around the lens, there is a risk that the suction collet is contacted with the lens. As a result, there is a risk that the lens is damaged. Further, when the suction collet sucks an outer peripheral part of the lens, there is a risk of suction failures.

The other objects and novel features will become apparent from the description of the specification and the accompanying drawings.

An optical semiconductor device according to an embodiment includes: a semiconductor substrate having a first surface and a second surface facing the first surface; an electrode formed over the first surface of the semiconductor substrate; an optical element that is electrically coupled to the electrode and is formed in the semiconductor substrate; and a lens arranged on the second surface side of the optical element. A concave part is formed in the second surface of the semiconductor substrate, and the lens is arranged at the bottom of the concave part. A top part on the second surface side of the lens is located on the first surface side relative to the second surface located around the concave part.

According to the optical semiconductor device of the embodiment, it is possible to suppress damage of a lens when being mounted and suction failures of a chip.

DETAILED DESCRIPTION

Hereinafter, an embodiment will be described with reference to the drawings. It should be noted that the same or corresponding parts are followed by the same signs in each drawing. Further, at least, a part of the embodiment described below may be arbitrarily combined with another.

Hereinafter, a structure of an optical semiconductor device OS according to the embodiment will be described.

The optical semiconductor device OS according to the embodiment is a semiconductor light receiving device or a semiconductor light emitting device. When the optical semiconductor device OS is a semiconductor light receiving device, the optical semiconductor device OS is, for example, a PIN photodiode. When the optical semiconductor device OS is a semiconductor light emitting device, the optical semiconductor device OS is, for example, an LED (Light Emitting Diode). However, the optical semiconductor device OS is not limited to these. In the following description, the optical semiconductor device OS is a PIN photodiode as the embodiment.

(Basic Structure of Optical Semiconductor Device According to Embodiment)

First, a basic structure of the optical semiconductor device OS according to the embodiment will be described.

Figure 1:
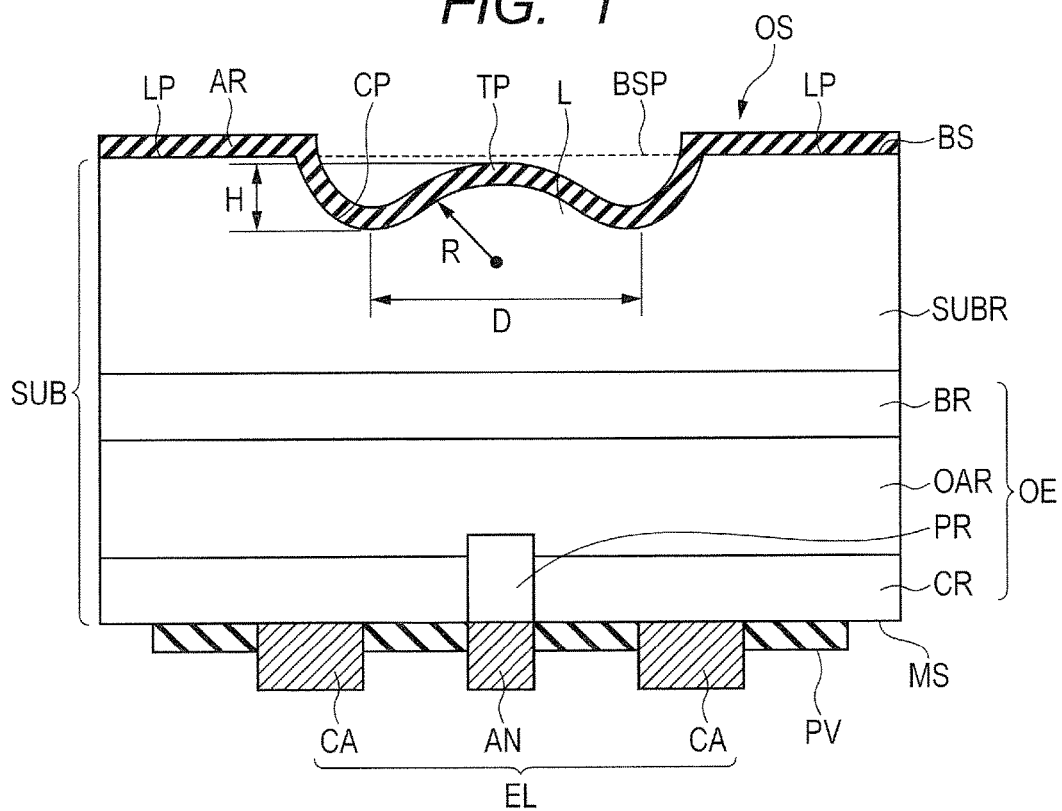
FIG. 1 is a cross-sectional view of an optical semiconductor device according to an embodiment.

As shown in FIG. 1, the optical semiconductor device OS has a semiconductor substrate SUB, an electrode EL, and an optical element OE. The semiconductor substrate SUB has a main surface (first surface) MS and aback surface (second surface) BS. The main surface MS is a surface facing the back surface BS. A concave part CP is formed in the back surface BS. The electrode EL is formed over the main surface MS. The optical element OE is formed in the semiconductor substrate SUB, and is electrically coupled to the electrode EL. The optical element OE is formed in the semiconductor substrate SUB.

The optical semiconductor device OS has a lens L. The lens L is arranged on the back surface BS side of the semiconductor substrate SUB. Specifically, the lens L is arranged at the bottom of the concave part CP. Namely, the lens L is arranged on the back surface BS side of the optical element OE. The lens L has a top part TP of the back surface BS. The back surface BS of the semiconductor substrate SUB has a lens outer peripheral part LP. The lens outer peripheral part LP is formed around the concave part CP in planar view (namely, when viewed from the direction vertical to the back surface BS of the semiconductor substrate SUB). The top part TP of the lens L is located at a position lower than the back surface BS located at the lens outer peripheral part LP. Namely, the top part TP of the lens L is located on the main surface MS side relative to a height position BSP (back surface BS) of the lens outer peripheral part LP.

(Structure of Semiconductor Substrate)

The semiconductor substrate SUB has, for example, a substrate region SUBR, a buffer region BR, an optical absorption region OAR, a cap region CR, and a p-type region PR. The substrate region SUBR is arranged on the back surface BS side of the semiconductor substrate SUB. The substrate region SUBR has, for example, n-type semi-insulation. The substrate region SUBR is, for example, InP (Indium Phosphide).

The buffer region BR is formed on the main surface MS side of the substrate region SUBR. The buffer region BR has, for example, n-type conductivity. The buffer region BR is, for example, InP. The buffer region BR is formed to reduce the amount of crystal defects introduced into the optical absorption region OAR by alleviating lattice constant mismatch between the optical absorption region OAR and the substrate region SUBR.

The optical absorption region OAR is arranged on the main surface MS side of the buffer region BR. The optical absorption region has, for example, n-type conductivity. The optical absorption region OAR absorbs incident light. Accordingly, electrons and holes are generated in the optical absorption region OAR. The optical absorption region OAR is, for example, InGaAs (Indium Gallium Arsenide).

The cap region CR is arranged on the main surface MS side of the optical absorption region OAR. The cap region CR has, for example, n-type conductivity. The cap region CR is, for example, InP.

The p-type region PR is formed in the cap region CR and the optical absorption region OAR. The p-type region PR is contacted with the main surface MS. The p-type region PR extends towards the back surface BS side. Accordingly, the p-type region PR penetrates the cap region CR, and slightly enters the optical absorption region OAR. Namely, the p-type region PR forms a p-n junction in the optical absorption region OAR. Therefore, a depletion layer is formed near the interface between the p-type region PR and the optical absorption region OAR. The buffer region BR, the p-type region PR, the optical absorption region OAR, and the cap region CR configure the optical element OE.

It should be noted that the structure of the semiconductor substrate SUB is not limited to the above-described structure. For example, silicon (Si) may be used for the semiconductor substrate SUB instead of the compound semiconductor.

The electrode EL is formed over the main surface MS of the semiconductor substrate SUB. The electrode EL has an anode AN and cathodes CA. The cathodes CA are formed over the cap region CR, and are electrically coupled to the cap region CR. The anode AN is formed over the p-type region PR, and is electrically coupled to the p-type region PR. Therefore, the optical element OE is electrically coupled to the electrode EL. For example, titanium (Ti), platinum (Pt), or gold (Au) is used for the electrode EL.

A protective film PV is formed over the cap region CR. The protective film PV is formed to protect the main surface MS of the optical semiconductor device OS. The protective film PV is, for example, silicon nitride (SiN).

(Structure of Lens)

Next, a structure of the lens L will be described.

The lens L is preferably configured as a part of the substrate region SUBR. The lens L has a height H and a diameter D. When the lens L is viewed from the direction vertical to the back surface BS, the lens L has a circular shape (see FIG. 8B), and the diameter D is the diameter of the circular shape. The lens L has a curved surface shape protruding towards the back surface BS side. The curved surface shape of the lens L has a curvature R. The curvature R is changed depending on the height H and the diameter D of the lens L.

The surface roughness of the back surface BS at the lens outer peripheral part LP is preferably smaller than that of the lens L. The surface roughness of the back surface BS at the lens outer peripheral part LP and the surface roughness of the lens L are measured by a surface step profiler.

An antireflection film AR is formed over the surface of the lens L. Accordingly, the light entering the lens L is suppressed from being reflected on the surface of the lens L, and the utilization efficiency of light and the sensitivity of the optical semiconductor device OS according to the embodiment are improved.

For example, SiN is used for the antireflection film AR. The thickness of the antireflection film AR is preferably equal to an integral multiple of a value obtained by dividing the wavelength of the incident light by four times the refractive index of a material used for the antireflection film AR. The material used for the antireflection film AR is, for example, SiN.

(Module Using Optical Semiconductor Device)

Hereinafter, an optical module using the optical semiconductor device OS will be described.

Figure 2:
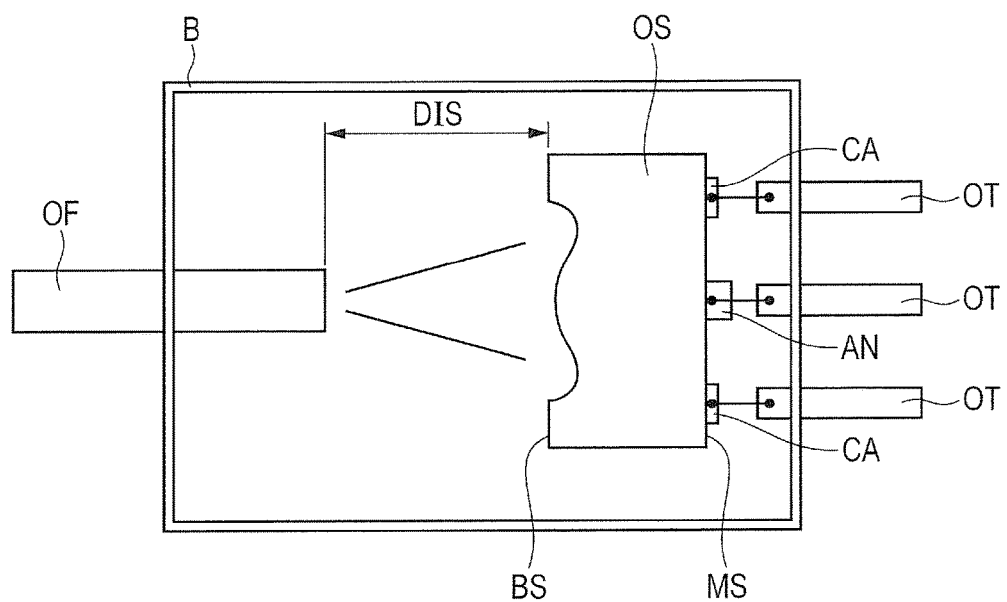
FIG. 2 is a schematic view of an optical module having the optical semiconductor device according to the embodiment.

As shown in FIG. 2, the optical module has the optical semiconductor device OS, a housing B, an optical fiber OF, and external terminals OT. The optical semiconductor device OS is fixed to the inside of the housing B. The optical fiber OF is inserted into the inside of the housing B, so that the tip thereof is located inside the housing. One end of each external terminal OT is inserted so as to be located inside the housing B. The other end of each external terminal OT protrudes outside the housing B. The anode AN and the cathodes CA formed over the back surface of the optical semiconductor device OS are electrically coupled to one ends of the external terminals OT.

The optical semiconductor device OS is arranged in such a manner that the back surface BS side thereof faces the tip of the optical fiber OF. Accordingly, the light from the optical fiber OF is condensed at the optical absorption region OAR by the lens L. The optical semiconductor device OS is arranged at a position having a distance DIS from the tip of the optical fiber OF. The distance DIS can be changed by design specifications of the module. Therefore, the curvature R of the lens L to be required is changed by design specifications of the module.

(Operation of Optical Semiconductor Device)

Next, an operation of the optical semiconductor device OS will be described.

The incident light from the optical fiber OF passes through the lens L of the optical semiconductor device OS. The light having passed through the lens L is condensed at the optical absorption region OAR. Electrons and holes are generated by the light condensed at the optical absorption region OAR. The generated holes and electrons are drifted in the depletion layer formed in the p-n junction between the optical absorption region OAR and the p-type region PR by a voltage applied between the anode AN and the cathodes CA, and are moved to the anode AN and the cathodes CA. The optical semiconductor device OS according to the embodiment detects the incident light by detecting a current generated by the movement.

(Manufacturing Method of Optical Semiconductor Device)

Hereinafter, a manufacturing method of the optical semiconductor device OS according to the embodiment will be described.

Figure 3:
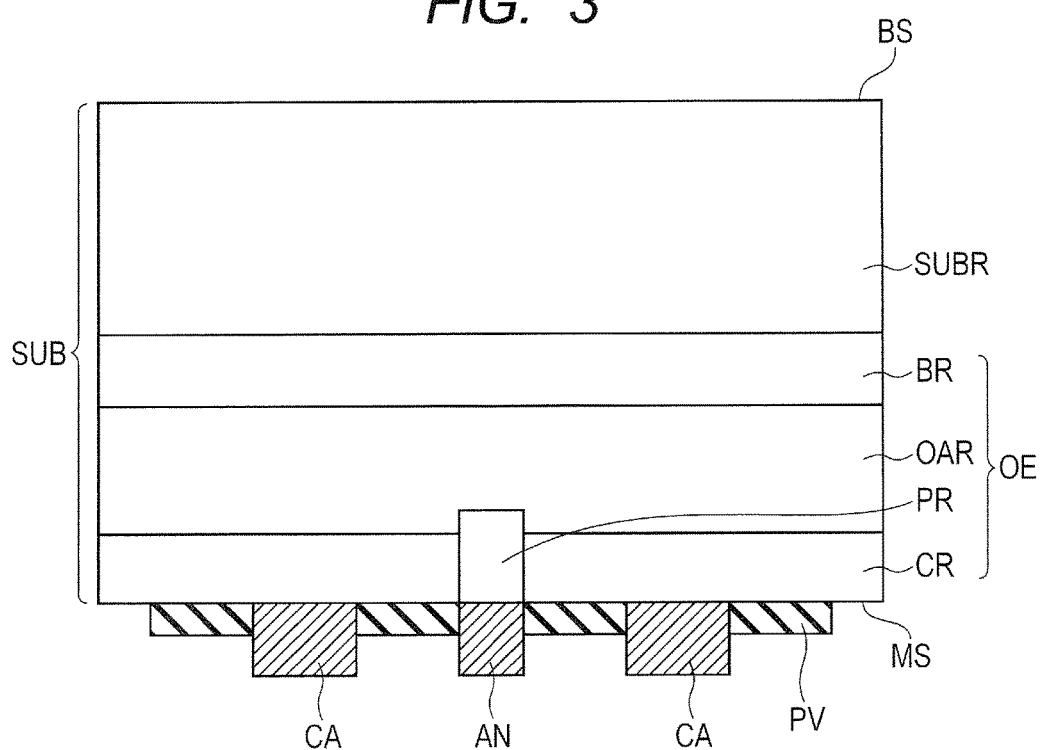
FIG. 3 is a cross-sectional view in a substrate process of the optical semiconductor device according to the embodiment.

The manufacturing method of the optical semiconductor device OS has a substrate process S1 and a lens process S2. The lens process S2 has a mask process S21 and an etching process S22. In the substrate process S1, as shown in FIG. 3, the optical element OE is formed in the semiconductor substrate SUB using a general semiconductor process. Further, in the substrate process S1, the electrode EL electrically coupled to the optical element OE is formed over the main surface MS of the semiconductor substrate SUB using a general semiconductor process. Further, in the substrate process S1, the protective film PV is formed over the main surface MS of the semiconductor substrate SUB using a general semiconductor process.

In the substrate process S1, after the semiconductor substrate SUB, the optical element OE, the electrode EL, and the protective film PV are formed, the back surface BS of the substrate region SUBR is polished. Therefore, the back surface BS of the substrate region SUBR has a flat surface at this stage.

The mask process S21 has a preceding mask (second mask) formation process S21a and a subsequent mask (first mask) formation process S21b. It is not necessary to include the preceding mask formation process S21a in the mask process S21. The preceding mask formation process S21a is performed before the subsequent mask formation process S21b. The etching process S22 has a preceding etching (second etching) process S22a and a subsequent etching (first etching) process S22b. It is not necessary to include the preceding etching process S22a in the etching process S22. The preceding etching process S22a is performed before the subsequent etching process S22b.

Figure 4A:
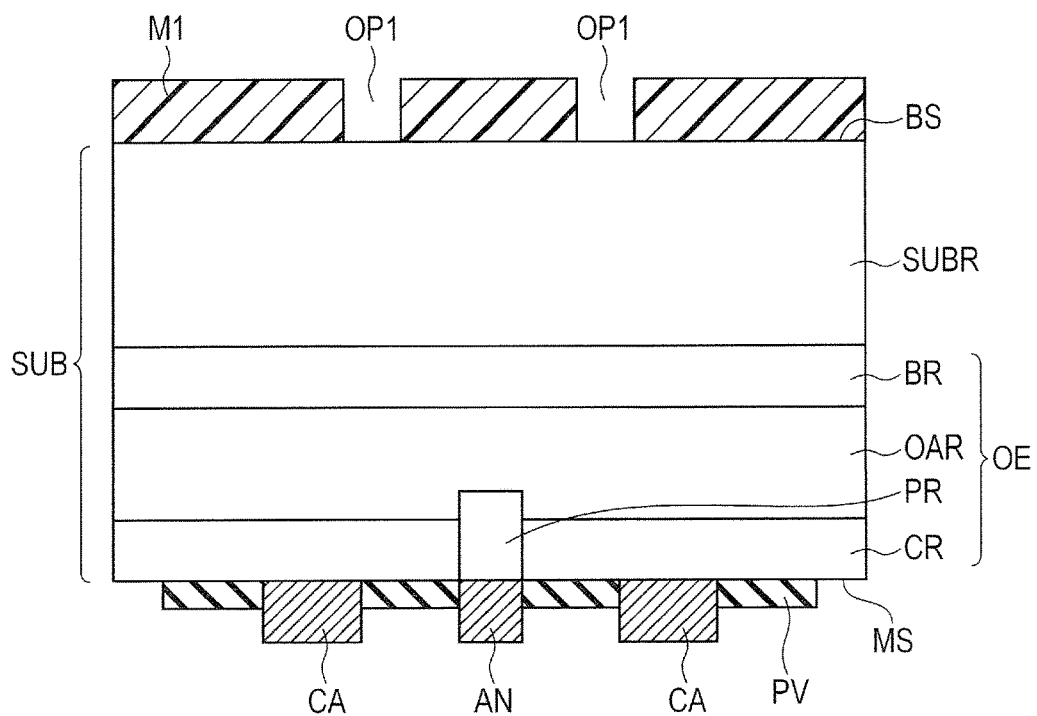
FIG. 4A and FIG. 4B are a cross-sectional view and a top view in a preceding mask formation process of the optical semiconductor device according to the embodiment.

FIG. 4A is a cross-sectional view of the optical semiconductor device OS in the preceding mask formation process S21a. As shown in FIG. 4A, in the preceding mask formation process S21a, a preceding mask (second mask) M1 is formed over the back surface BS. A photosensitive organic film such as a photoresist is preferably used for the preceding mask M1. However, the preceding mask M1 is not limited to this. For example, a hard mask may be used for the preceding mask M1. The preceding mask M1 has an opening OP1 (second opening).

Figure 4B:
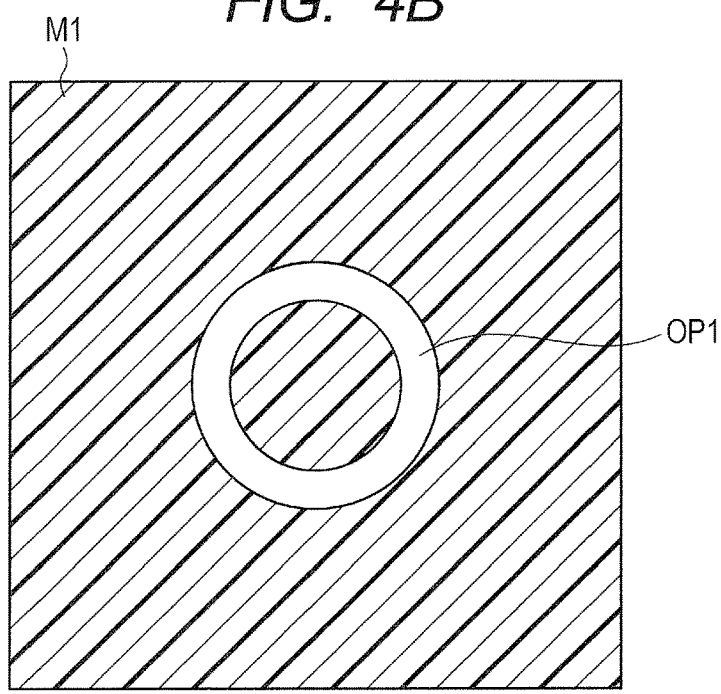

FIG. 4B is a top view of the optical semiconductor device OS in the preceding mask formation process S21a. As shown in FIG. 4B, the opening OP1 has a ring-like shape in planar view (viewed from the direction vertical to the back surface BS of the semiconductor substrate SUB). The back surface BS of the semiconductor substrate SUB is exposed from the opening OP1.

In the preceding etching process S22a, etching is performed on the back surface BS side of the semiconductor substrate SUB. The etching of the back surface BS side of the semiconductor substrate SUB is performed through the opening OP1.

The etching in the preceding etching process S22a is preferably isotropic etching. The etching in the preceding etching process S22a is preferably wet etching. However, the etching in the first etching process is not limited to this. For example, the etching in the preceding etching process S22a may be anisotropic etching.

Figure 5A:
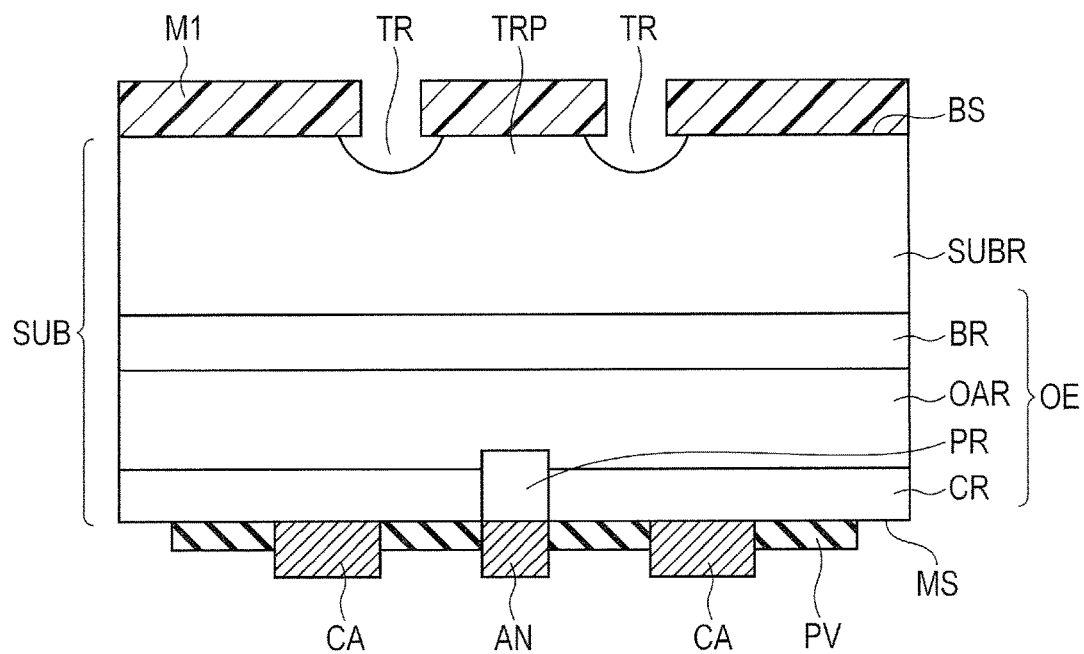
FIG. 5A and FIG. 5B are a cross-sectional view and a top view in a preceding etching process of the optical semiconductor device according to the embodiment.
Figure 6:
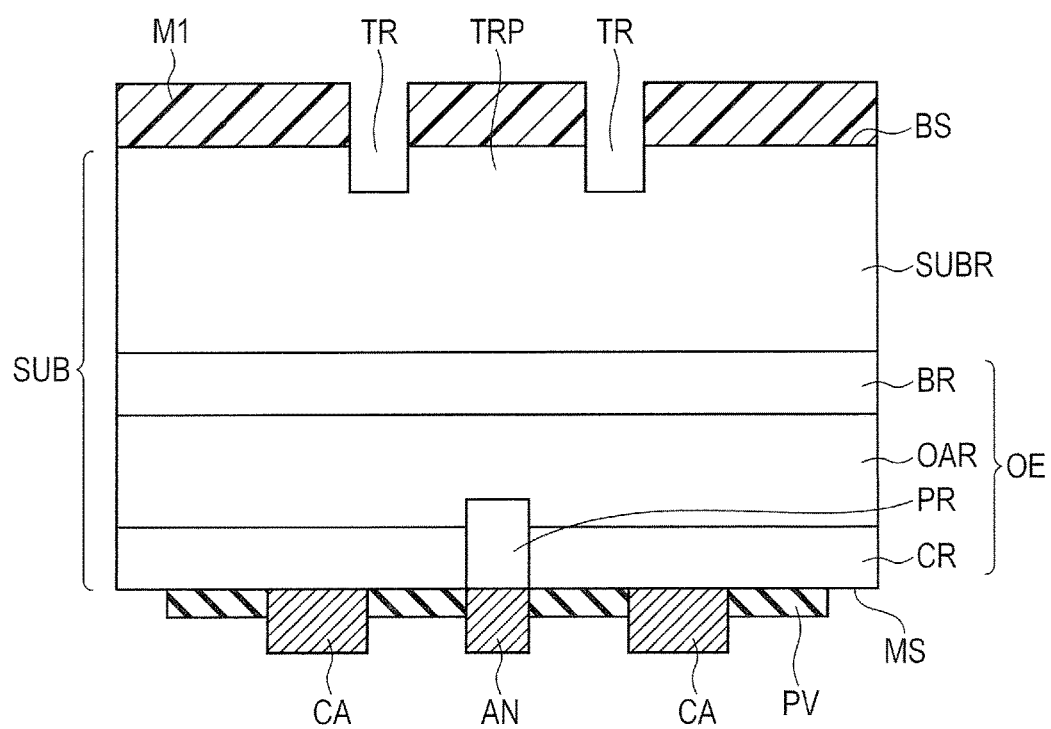
FIG. 6 is a cross-sectional view in the case where anisotropic etching was performed in the preceding etching process of the optical semiconductor device according to the embodiment.

FIG. 5A is a cross-sectional view of the optical semiconductor device OS in the preceding etching process S22a. As shown in FIG. 5A, in the preceding etching process S22a, the back surface BS of the semiconductor substrate SUB exposed from the opening OP1 is removed. Accordingly, a trench TR and a trapezoidal part TRP are formed in the back surface BS of the semiconductor substrate SUB. The cross-sectional shape of the trench TR is a curved surface shape protruding downward. The cross-sectional shape of the trapezoidal part TRP is a trapezoidal shape protruding upward. It should be noted that in the case where the etching preformed in the preceding etching process S22a is anisotropic etching, the cross-sectional shape of the trench TR becomes a rectangular shape as shown in FIG. 6, and the width of the trench TR becomes narrower as compared to a case in which the etching performed in the preceding etching process S22a is isotropic etching. Further, in this case, the cross-sectional shape of the trapezoidal part TRP also becomes a rectangular shape.

Figure 5B:
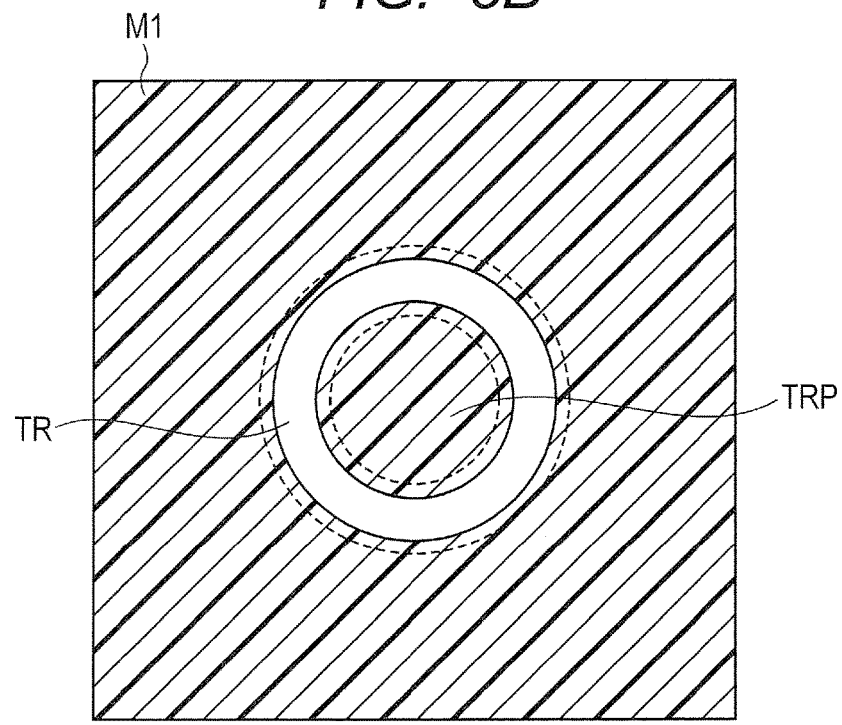

FIG. 5B is a top view of the optical semiconductor device OS in the preceding etching process S22a. As shown in FIG. 5B, the trench TR has a ring-like shape in planar view (viewed from the direction vertical to the back surface BS of the semiconductor substrate SUB). The trapezoidal part TRP has a circular shape in planar view.

It should be noted that the preceding mask M1 is removed by asking and the like after the preceding etching process S22a is completed.

Figure 7A:
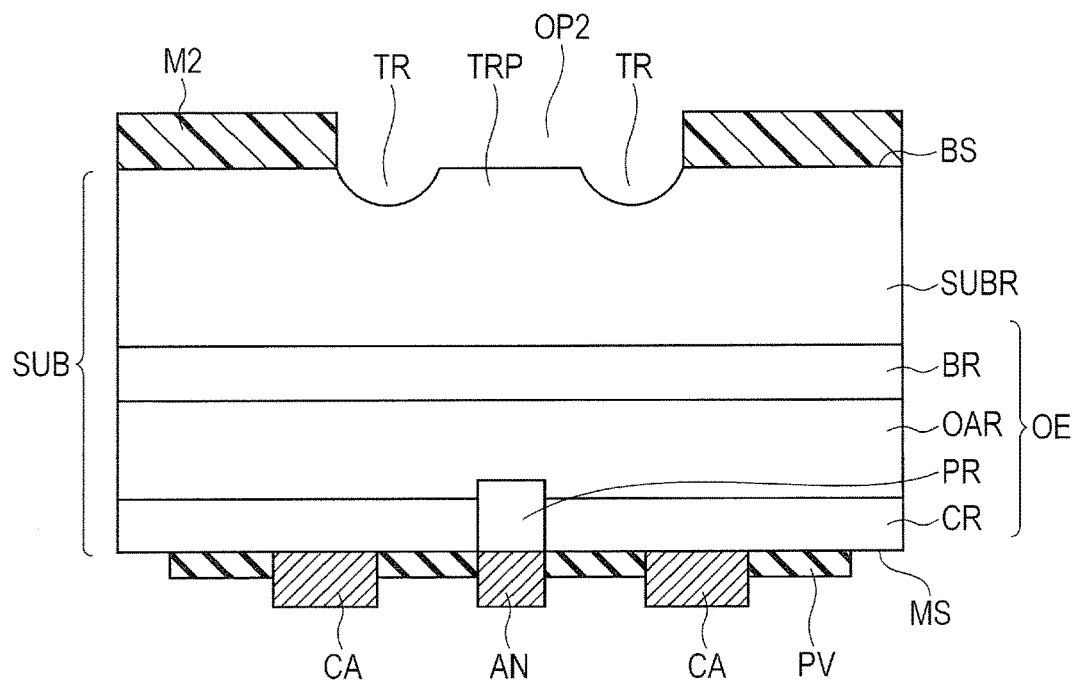
FIG. 7A and FIG. 7B are a cross-sectional view and a top view in a subsequent mask formation process of the optical semiconductor device according to the embodiment.

FIG. 7A is a cross-sectional view of the optical semiconductor device OS in the subsequent mask formation process S21b. As shown in FIG. 7A, in the subsequent mask formation process S21b, a subsequent mask (first mask) M2 is formed over the back surface BS of the semiconductor substrate SUB. A photosensitive organic film such as a photoresist is preferably used for the subsequent mask M2. However, the subsequent mask M2 is not limited to this. For example, a hard mask may be used for the subsequent mask M2. The subsequent mask M2 has an opening OP2 (first opening).

Figure 7B:
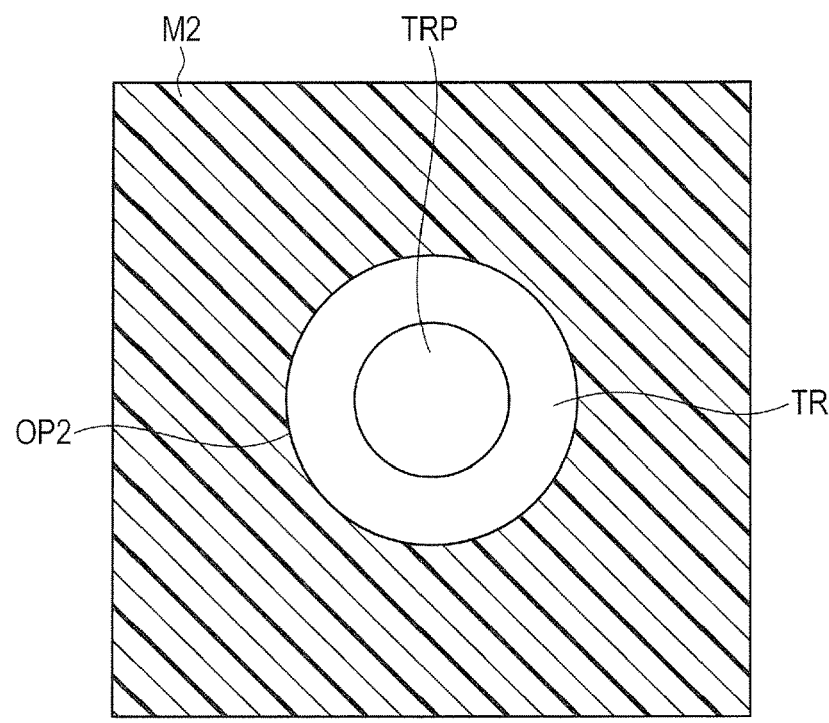

FIG. 7B is a top view of the optical semiconductor device OS in the subsequent mask formation process S21b. As shown in FIG. 7B, the opening OP2 has a circular shape in planar view (viewed from the direction vertical to the back surface BS of the semiconductor substrate SUB). A second surface of the semiconductor substrate SUB is exposed from the opening OP2. The opening OP2 is formed on the inner side relative to the outer periphery of the trench TR in planar view. Namely, while the subsequent mask M2 covers the back surface BS of the semiconductor substrate SUB located on the outer side relative to the outer periphery of the trench TR, the back surface BS of the semiconductor substrate SUB located on the inner side relative to the outer periphery of the trench TR is exposed from the opening OP2.

In the subsequent etching process S22b, etching is performed on the back surface BS side of the semiconductor substrate SUB. The etching of the back surface BS side of the semiconductor substrate SUB is performed through the opening OP2.

The etching performed in the subsequent etching process S22b is isotropic etching. The etching performed in the subsequent etching process S22b is preferably wet etching.

Figure 8A:
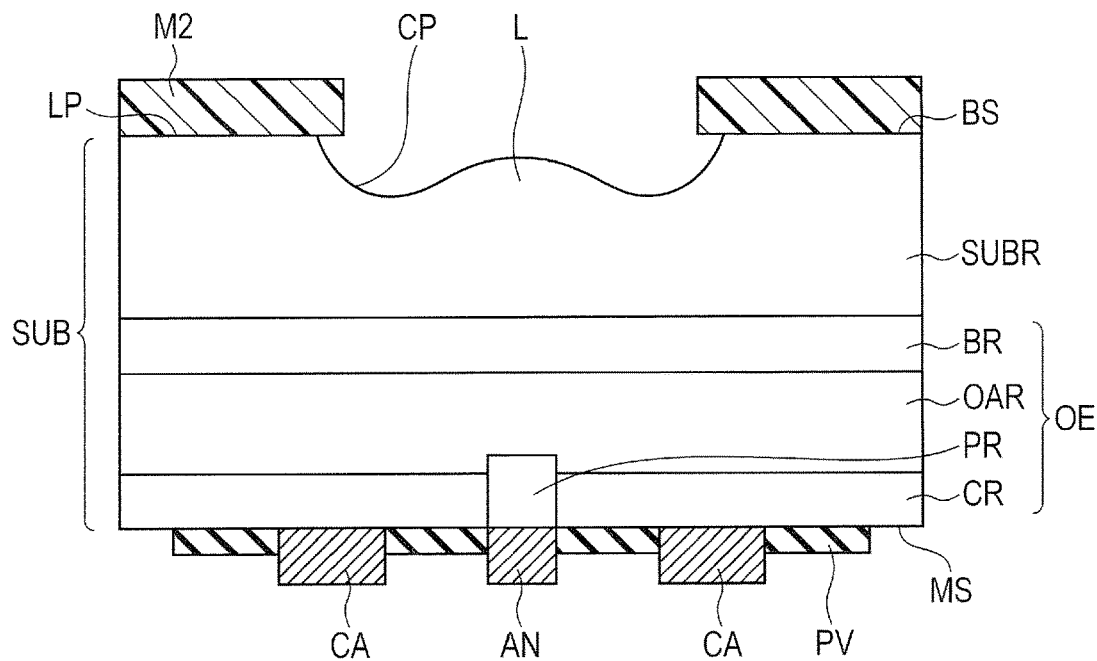
FIG. 8A and FIG. 8B are a cross-sectional view and a top view in a subsequent etching process of the optical semiconductor device according to the embodiment.
Figure 8B:
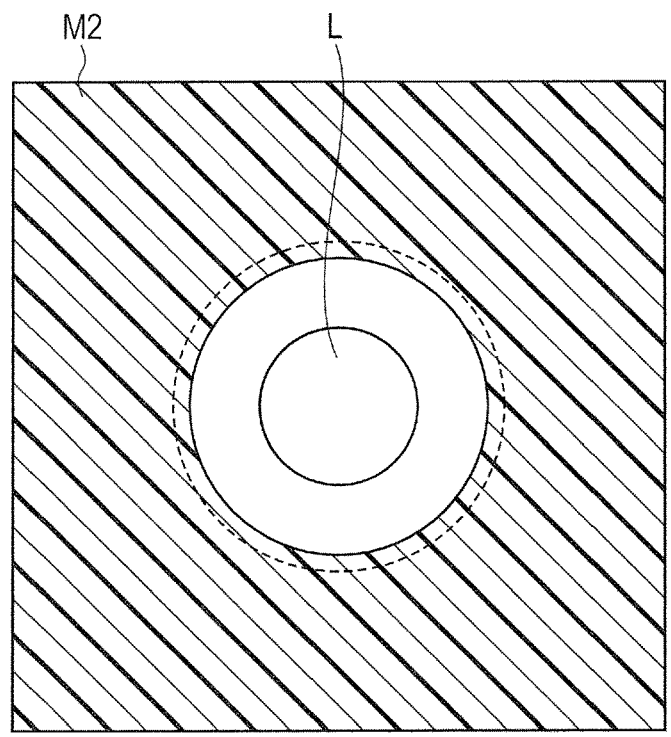
Figure 9:
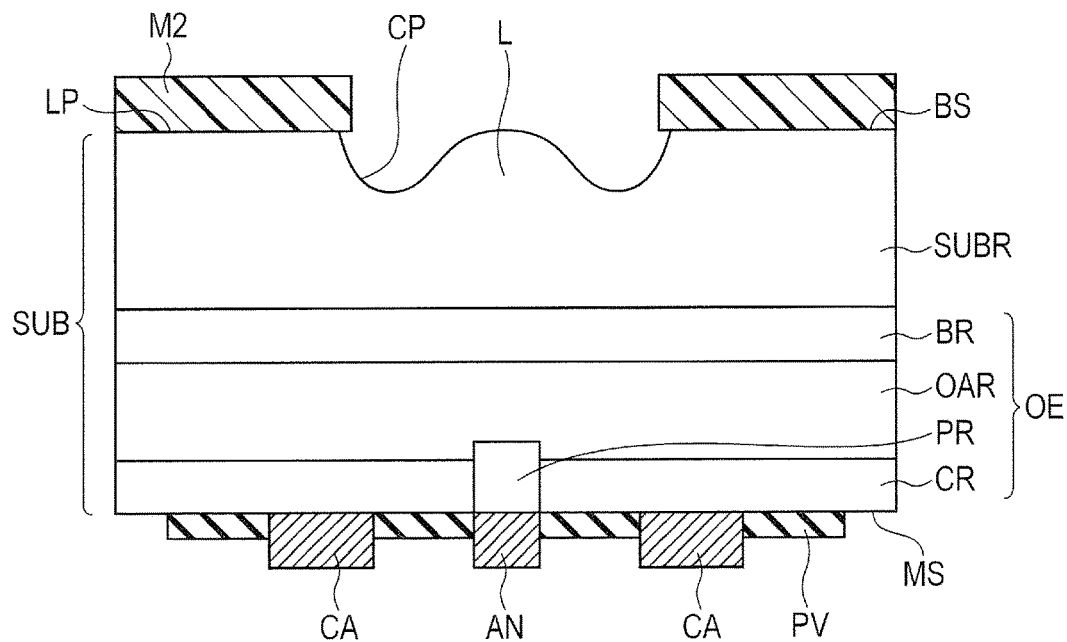
FIG. 9 is a cross-sectional view in the subsequent etching process of the optical semiconductor device according to the embodiment in the case where anisotropic etching was performed in the preceding etching process.

In the subsequent etching process S22b, as shown in FIG. 8, the concave part CP and the lens L located at the bottom of the concave part CP are formed. The lens L and the concave part CP are formed by removing the back surface BS of the semiconductor substrate SUB exposed from the opening OP2 in the subsequent etching process S22b. The lens L is formed as a result of rounding the corners of the trapezoidal part TRP by isotropic etching in the subsequent etching process S22b. The concave part CP is formed by isotropic etching of the trench TR in the subsequent etching process S22b. A region on the back surface BS that is not etched while being covered with the subsequent mask M2 and the preceding mask M1 becomes the lens outer peripheral part LP. It should be noted that in the case where anisotropic etching is performed in the preceding etching process S22a, the region of the lens outer peripheral part LP becomes wider as shown in FIG. 9. Namely, the region (region where the concave part CP and the lens L are formed) where the lens L is formed becomes narrower. This is because the width of the trench TR formed in the preceding etching process S22a is narrow.

It should be noted that the subsequent mask M2 is removed by asking and the like after the subsequent etching process S22b is completed.

As described above, the lens outer peripheral part LP is not etched because the lens outer peripheral part LP is covered with the subsequent mask M2 and the preceding mask M1 during the subsequent etching process S22b and the preceding etching process S22a. Therefore, the surface roughness of the lens outer peripheral part LP of the back surface BS of the semiconductor substrate SUB is smaller than that of the etched lens L.

As described above, the distance DIS between the tip of the optical fiber OF and the optical semiconductor device OS in the optical module is changed by design specifications of the optical module. Therefore, if the design specifications of the optical module are changed, the curvature R of the lens L to be required is changed.

The diameter of the opening OP2 and the amount of etching of the semiconductor substrate SUB in the subsequent etching process S22b and the preceding etching process S22a can be changed. The height H and the diameter D of the lens L can be changed by changing these conditions. Namely, the curvature R of the lens L can be changed by changing these conditions. Therefore, it is possible to adapt to changes in the design specifications of the optical module by changing these conditions.

Figure 10:
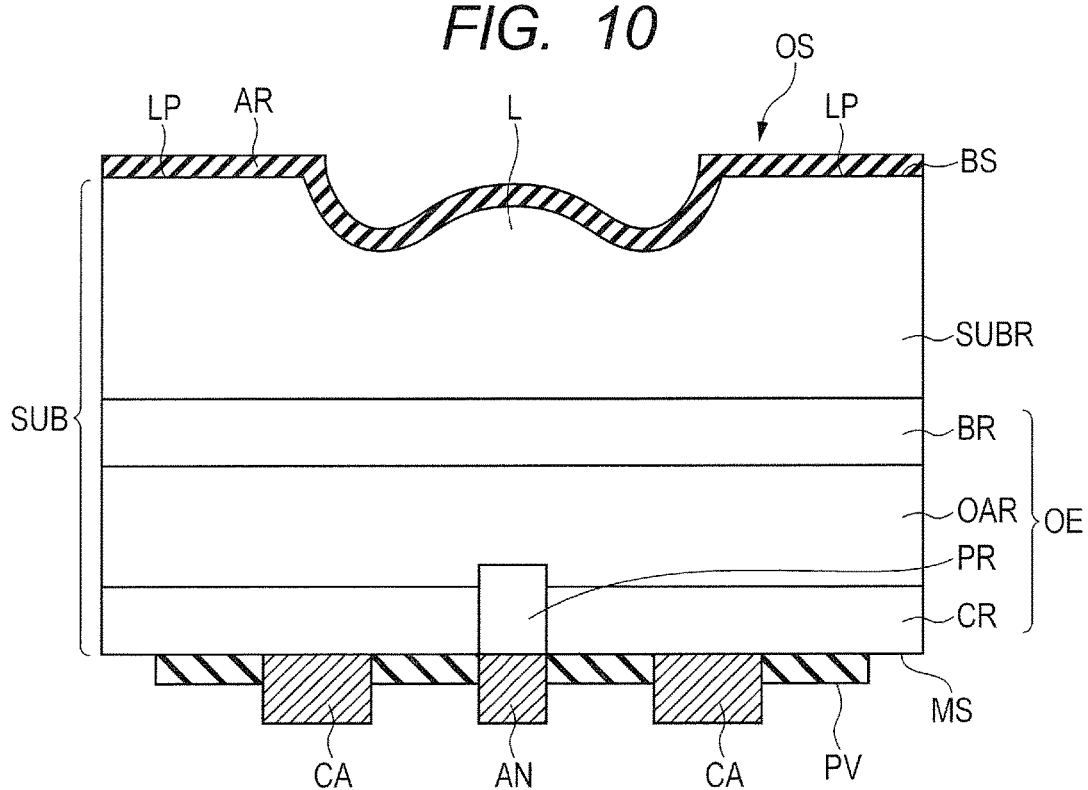
FIG. 10 is a cross-sectional view in an antireflection film formation process of the optical semiconductor device according to the embodiment.

The manufacturing method of the optical semiconductor device OS may further have an antireflection film formation process S3. As shown in FIG. 10, in the antireflection film formation process S3, the antireflection film AR is formed over the lens L. The antireflection film AR is formed by, for example, CVD (Chemical Vapor Deposition) or the like.

(Effect of Optical Semiconductor Device According to Embodiment)

Hereinafter, effects of the optical semiconductor device according to the embodiment will be described while being compared with a comparison example.

First, a configuration of an optical semiconductor device according to the comparison example will be described.

Figure 11:
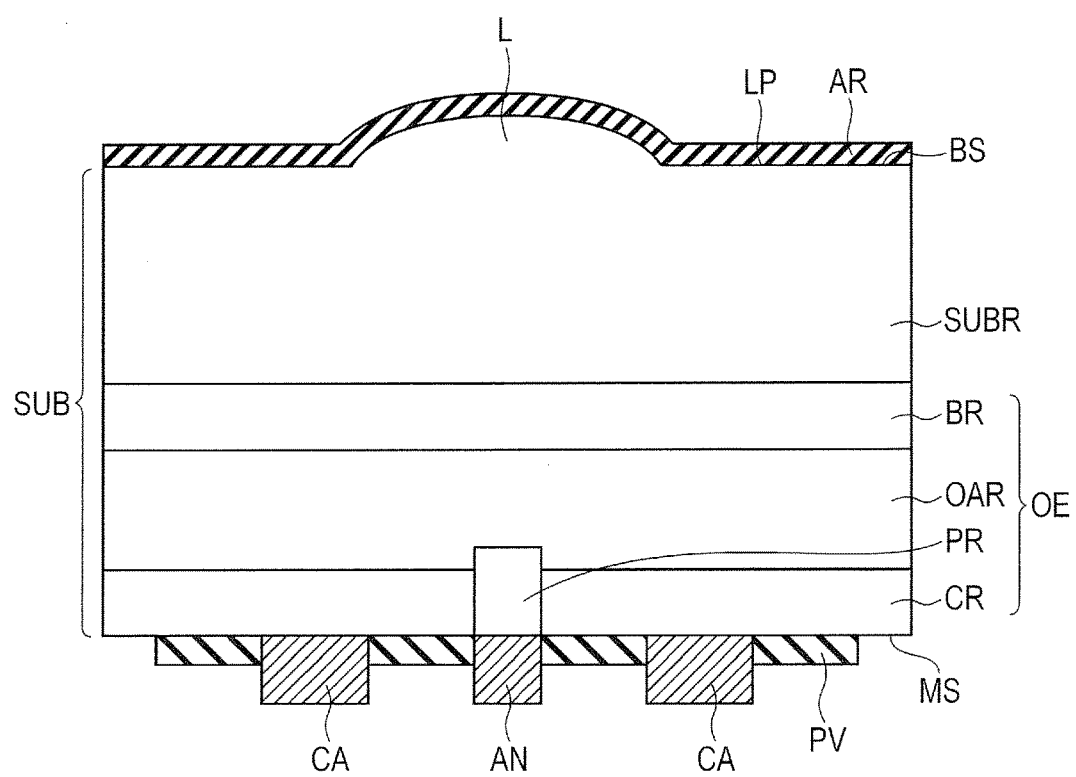
FIG. 11 is a cross-sectional view of an optical semiconductor device according to a comparison example.

As shown in FIG. 11, a configuration of the optical semiconductor device according to the comparison example is different from the optical semiconductor device according to the embodiment in that a lens L is formed at a position higher than a lens outer peripheral part LP (back surface BS). It should be noted that the other configurations of the comparison example are nearly the same as those of the optical semiconductor device OS according to the embodiment shown in FIG. 1. Thus, the same constitutional elements are followed by the same signs, and the explanation thereof will not be repeated.

Next, a lens process S2 in the optical semiconductor device according to the comparison example will be described. It should be noted that a substrate process S1 and an antireflection film formation process S3 in the optical semiconductor device according to the comparison example are the same as those in the optical semiconductor device OS according to the embodiment.

The lens process S2 in the optical semiconductor device according to the comparison example has a photoresist formation process S23 and an etch-back process S24.

Figure 12A:
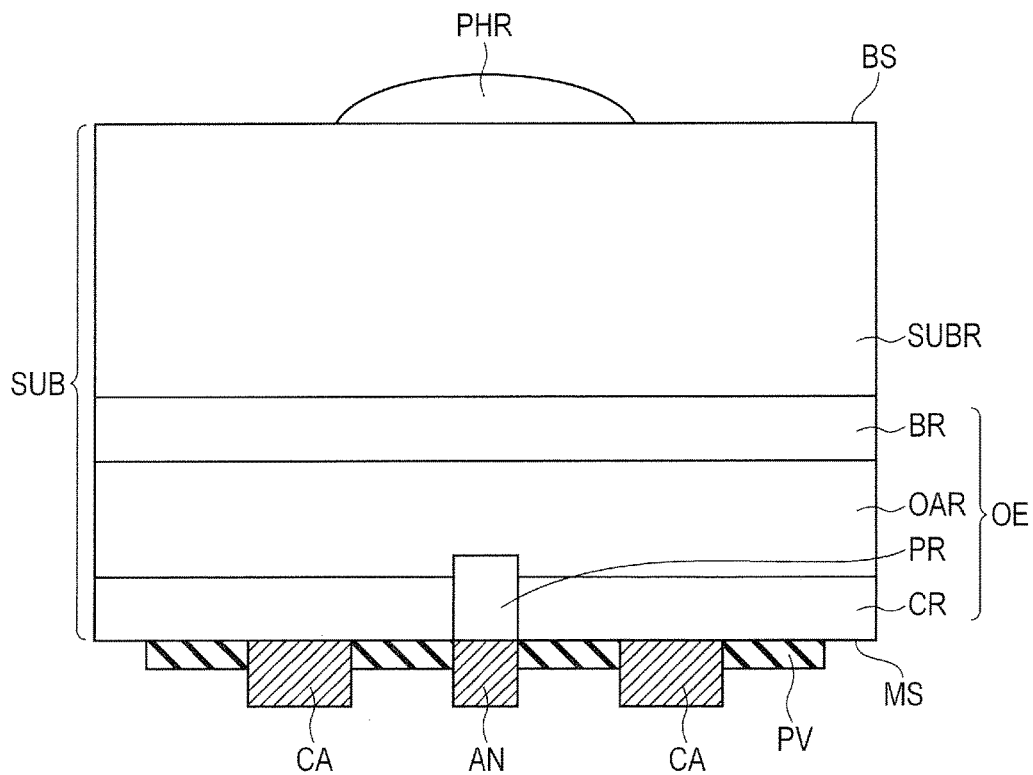
FIGS. 12A and 12B are cross-sectional views in a photoresist formation process and an etch-back process of the optical semiconductor device according to the comparison example.

FIG. 12A is a cross-sectional view of the optical semiconductor device according to the comparison example in the photoresist formation process S23. As shown in FIG. 12A, in the photoresist formation process S23, a photoresist PHR is formed on the back surface BS side of the semiconductor substrate SUB. The photoresist PHR has a lens shape. The photoresist PHR in a lens shape is formed in such a manner that the photoresist PHR formed over the back surface BS of the semiconductor substrate SUB is patterned or the patterned photoresist PHR is baked.

Figure 12B:
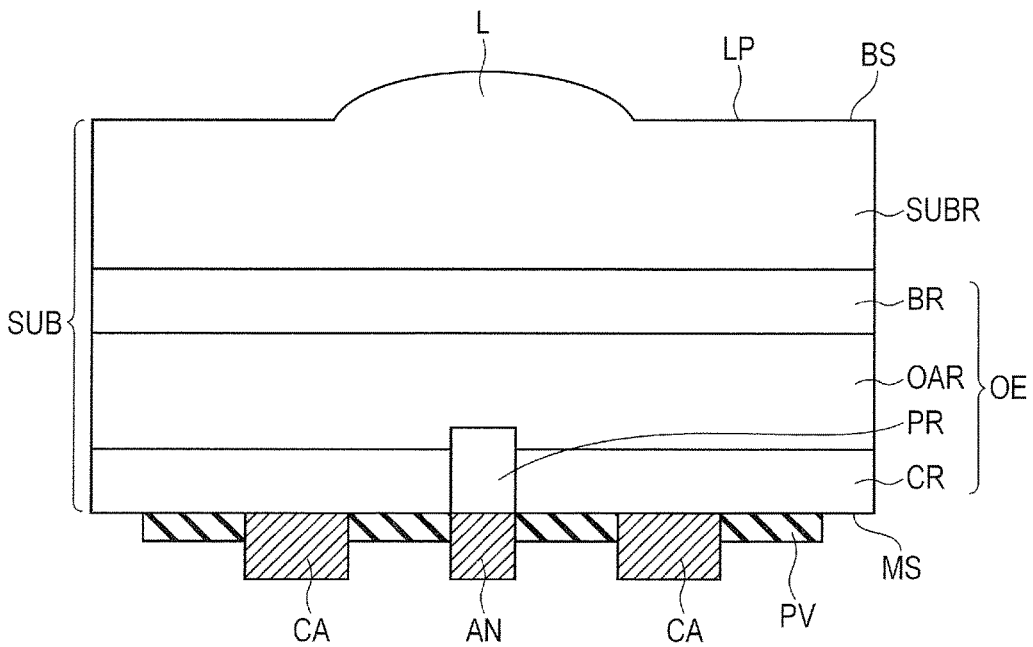

In the etch-back process S24, the semiconductor substrate SUB is etched. The etching of the semiconductor substrate SUB is performed using the photoresist PHR having a lens shape as a mask. FIG. 12B is a cross-sectional view of semiconductor elements according to the comparison example in the etch-back process S24. As shown in FIG. 12B, the lens shape of the photoresist PHR is transferred to the semiconductor substrate SUB by the etch-back process S24, and the lens L is formed.

In the optical semiconductor device according to the comparison example, a top part TP of the lens L is provided at a position higher than the lens outer peripheral part LP. Therefore, when the lens outer peripheral part is sucked by a suction collet or the like, there is a possibility that the suction collet is contacted with the lens L. As a result, there is a risk that the lens L is damaged.

In the optical semiconductor device according to the comparison example, the photoresist PHR is not formed over the lens outer peripheral part LP. Therefore, the lens outer peripheral part LP is also etched in the etch-back process S24. Therefore, in the optical semiconductor device according to the comparison example, the surface roughness of the lens outer peripheral part LP becomes large.

On the other hand, in the optical semiconductor device OS according to the embodiment, the top part TP of the lens L is located at a position lower than the lens outer peripheral part LP. Therefore, when the lens outer peripheral part LP is sucked by a suction collet or the like, the suction collet is hardly contacted with the lens L. As a result, according to the optical semiconductor device OS of the embodiment, it is possible to suppress the lens L from being damaged.

In the optical semiconductor device OS according to the embodiment, when the surface roughness in the lens outer peripheral part LP of the back surface BS of the semiconductor substrate SUB is smaller than that of the lens L, it is possible to suppress the suction collet from being moved when sucking.

According to the manufacturing method of the optical semiconductor device OS of the embodiment, it is possible to form the configuration of the optical semiconductor device OS according to the embodiment.

In the case where the preceding mask formation process S21a and the preceding etching process S22a are performed in the manufacturing method of the optical semiconductor device OS according to the embodiment, it is possible to easily form the lens L.

In the case where the preceding etching process S22a is performed by anisotropic etching in the manufacturing method of the optical semiconductor device OS according to the embodiment, the width of the trench TR can be narrowed. Namely, in this case, the region where the lens L is formed can be narrowed. Therefore, in this case, it is possible to use a smaller suction collet when being mounted.

In the case where the preceding etching process S22a is performed by isotropic etching in the manufacturing method of the optical semiconductor device OS according to the embodiment, the gentle surface of the lens L can be easily formed.

In the case where the subsequent mask M2 and the preceding mask M1 are formed using photosensitive organic films such as photoresists in the manufacturing method of the optical semiconductor device OS according to the embodiment, it is possible to maintain the flatness of the back surface BS of the semiconductor substrate SUB.

In the case where the subsequent etching process S22b is performed by isotropic etching in the manufacturing method of the optical semiconductor device OS according to the embodiment, it is possible to allow the surface of the lens L to have a gentle curvature R.

The embodiment disclosed herein should be considered as not restrictive but illustrative only in all respects. The scope of the present invention is represented by not the above-described embodiment but claims, and is intended to include meanings equivalent to claims and all changes within the scope.

What is claimed is:

1. An optical semiconductor device comprising:
   a semiconductor substrate having a first surface and a second surface facing the first surface;
   an electrode formed over the first surface of the semiconductor substrate; an optical element that is electrically coupled to the electrode and is formed in the semiconductor substrate; and
   a lens arranged on the second surface side of the optical element, wherein a concave part is formed in the second surface of the semiconductor substrate, and the lens is arranged at the bottom of the concave part,
   wherein a top part on the second surface side of the lens is located on the first surface side relative to the second surface located around the concave part, and
   wherein, in a cross-sectional view, the concave part has a smoothly curved surface extending from the lens to the second surface of the semiconductor substrate.

2. The optical semiconductor device according to claim 1, further comprising an antireflection film arranged over the lens.

3. The optical semiconductor device according to claim 1, wherein surface roughness of the second surface located around the concave part is smaller than that of the lens.

* * * * *